United States Patent [19]
Huang et al.

[11] Patent Number: 5,522,021
[45] Date of Patent: May 28, 1996

[54] WORD BOUNDARY PARAMETER EVALUATION FOR BIT BLOCK TRANSFER OPERATION IN A COMPUTER GRAPHICS SYSTEM

[75] Inventors: Chun-Kai Huang, Taichung; Wei-Kuo Chia, Hsinchu; Chun-Chieh Hsiao, Taichung; Jiun-Ming Chu, Iainan, all of Taiwan

[73] Assignee: Industrial Technology Research Institute, Hsinchu, Taiwan

[21] Appl. No.: 207,790

[22] Filed: Mar. 8, 1994

[51] Int. Cl.[6] .................................................. G06T 3/00
[52] U.S. Cl. ........................ 395/138; 395/123; 395/164
[58] Field of Search ..................................... 395/123, 125, 395/127, 133–139, 142, 143, 155, 157, 158, 164–166

[56] References Cited

U.S. PATENT DOCUMENTS 4,882,683  11/1989  Rupp et al. ........................... 395/165
5,185,599  2/1993  Doornink et al. ..................... 395/143
5,313,576  5/1994  Providenza et al. ................... 395/164

Primary Examiner—Almis R. Jankus
Attorney, Agent, or Firm—Meltzer, Lippe, Goldstein, et al.

[57] ABSTRACT

A pixel block transfer system has a shifter, at least two registers, an extractor and a mask. Parameter evaluation logic is used to generate most of the parameters needed in the pixel block transfer. The start address of the source block, the start address of the destination block, the number of pixels in the source block and the number of rows in the source block are input to the parameter evaluation logic. The parameter evaluation logic then determines the left shift number, the number of read data, the number of write data, the two write flag, the two read flag, the left mask number and the right mask number. The start addresses, the flags and the read and write numbers are sent to a state machine. These are used to control the pixel block transfer. The left shift number is sent to the shifter and the extractor. It signifies the number of pixels to be shifted left. The left and right mask numbers are sent to the mask to control which pixels are masked and, therefore, not modifiable. The state machine also sends left and right enable signals to the mask.

24 Claims, 5 Drawing Sheets

FIG. 3

EXAMPLE 1 OR 3

WORD BOUNDARY

| | |
|---|---|
| SOURCE OR ORIGINAL BLOCK: | 1 2 3 4 |
| ORIGINAL DESTINATION: | a b c d \| e f g h |
| UPDATED DESTINATION: | a 1 2 3 \| 4 f g h |

EXAMPLE 2 OR 4

WORD BOUNDARY

| | |
|---|---|
| SOURCE OR ORIGINAL BLOCK: | 1 2 3 4 \| 5 6 7 8 |
| ORIGINAL DESTINATION: | a b c d \| e f g h |
| UPDATED DESTINATION: | 3 4 5 6 \| e f g h |

WORD BOUNDARY PARAMETER EVALUATION FOR BIT BLOCK TRANSFER OPERATION IN A COMPUTER GRAPHICS SYSTEM

FIELD OF THE INVENTION

The present invention can be used in the manufacture of windows accelerators or any area where similar word boundary problems exist.

BACKGROUND OF THE INVENTION

Windows are extensively used in computers not only because they provide a user-friendly interface but also because they can be used in a multi-tasking environment. The processing of windows in computers was originally completely handled by the CPU. However, the visual performance of windows processed by the CPU is not very satisfactory. The visual quality of windows was improved by the advent of windows accelerators which implement the processing of windows operations.

The most common operation in a windows system is windows transfer, also called block transfer or BIT BLT. To accelerate block transfer in a windows system, several pixels can be transferred simultaneously rather than one at a time. In a 32-bit word access architecture or bus, where one pixel equal 8 bits, 4 pixels can be processed at one time. For instance, a 32 bit bus can move two words (1 pixel=8 bits; 1 word=16 bits) through it from a memory to a display. The speed is, thereby, trebled. However, during the process a word boundary problem occurs. This problem is illustrated in FIG. 3 and the following two examples. In these examples, 1 word=32 bits, 1 pixel=8 bits and 1 word=4 pixels.

In the word y:

| P0 | P1 | P2 | P3 |
|----|----|----|----|

P0 represents the position of the first pixel, P1 represents the position of the second pixel, P2 represents the position of the third pixel and P3 represents the fourth pixel.

EXAMPLE 1

One Dimensional Block Transfer (BIT BLT)

The original or source block is 0:

| 0 | 1 | 2 | 3 |
|---|---|---|---|
| 1 | 2 | 3 | 4 | which is 1*4 pixels in size and has a start address (x,y)=(0, 0). Herein, (x,y) notation refers to the starting pixel of the widow transfer as being from the $x^m$ pixel in y row. The block is to be moved to the location (1,2) in the destination block. The destination block befire transfer is 2;

| 0 | 1 | 2 | 3 | 4 | 5 | 6 | 7 |
|---|---|---|---|---|---|---|---|
| a | b | c | d | e | f | g | h | pixel block formed by two adjacent words

| 0 | 1 | 2 | 3 | | 4 | 5 | 6 | 7 |
|---|---|---|---|---|---|---|---|---|
| a | b | c | d | and | e | f | g | h |

Then after, the block transfer the destination block becomes

| 0 | 1 | 2 | 3 | 4 | 5 | 6 | 7 |
|---|---|---|---|---|---|---|---|
| a | 1 | 2 | 3 | 4 | f | g | h |

Because it is a word access architecture, the data read out (1,2,3,4) would have to be written into the destination block two times and cannot be modified or updated to be pixels with locations of (0,2), (5,2), (6,2), and (7,2).

EXAMPLE 2

1*4 Block Transfer

The original or source block is 0:

| 0 | 1 | 2 | 3 | 4 | 5 | 6 | 7 |
|---|---|---|---|---|---|---|---|
| 1 | 2 | 3 | 4 | 5 | 6 | 7 | 8 | and the destination block is 2:

| 0 | 1 | 2 | 3 | 4 | 5 | 6 | 7 |
|---|---|---|---|---|---|---|---|
| a | b | c | d | e | f | g | h |

The 1*4 block starting from (2,0) is to be transferred to a starting location of (0,2). The destination block after transfer will be 2:

| 0 | 1 | 2 | 3 | 4 | 5 | 6 | 7 |
|---|---|---|---|---|---|---|---|
| 3 | 4 | 5 | 6 | e | f | g | h |

Since it is a word-access architecture, two words, (1,2,3,4) and (5,6,7,8), will have to read out to form (3,4,5,6). This word can then be written into the destination block.

In these two examples involving word-access architecture, the word boundary problem is handled by software. The process is very complicated and the implementing speed is relatively slow. Further, when it comes to writing the program, special attention must be given as to whether the data (4 pixels), after it is read out and processed, should be written into the destination block twice, as in Example 1, or whether two words should be read out to form one word and which formed word is then written into the destination block, as in Example 2. Furthermore, if the data block is not inside the word boundary, special attention must also be given to the fact that some pixels cannot be modified in program writing, as in Example 1.

Presently, in conventional graphics acceleration system hardware, the parameters required by a block transfer are all first calculated by a programmer using software. After this calculation the parameters are written into registers in the graphics chips,such as, DP 8510 and DP 8511 produced by National Semiconductor. There are many products which can speed up the BIT BLT Function, for example, the National Semiconductor Corporations DP 8510 and DP 8511. But the parameters for moving a window must first be written into the registers on these chips. The present invention provides a method to calculate these parameters using circuitry instead of software. The performance and cost of the inventive system will be better than the conventional systems and methods.

SUMMARY OF THE INVENTION

The present invention solves these problems and speeds up the processing time and performance of the BIT BLT operation. The parameters required by a block transfer are processed internally by the graphics chips. To transfer a block, a programmer only defines and writes into the register inside the graphics chip, the start address and destination address of the original block to be transferred and the size of the block to be transferred. Logic circuitry is used to calculate the other parameters.

In conventional systems, a programmer has to use the CPU or a calculator to compute the required parameters and write them into a register. According to the present invention, these steps can be omitted.

In terms of cost, the DP 8510 and DP 8511 used in conventional systems, among the graphics systems developed by the National Semiconductor, require a DP 8500 to calculate the parameters for block transfers. In the present invention, only a few circuits are used. These circuits take up no more than a few hundred gate counts which represent less than 0.1% of the whole chip. In terms of system efficiency, the conventional architecture requires altogether seven parameters: the start address of the original block, the destination address, the size of the block, the left mask number, the right mask number, TWO-Read and TWO-Write status and the left shift number. The present invention requires only three parameters: the start address and the destination address of the block, and the size of the block to be transferred. Thus, the present inventive architecture is better than the conventional architecture in terms of cost and efficiency.

These and other objects and advantages are achieved by the present invention in the following manner.

One embodiment of the present invention provides a system for a pixel block transfer of a source block to a destination block. This system comprises a parameter evaluation logic which receives a first set of parameters and outputs a second set of parameters based on said first set of parameters, state machine which receives parameters from said second set of parameters and at least two parameters of the first set, shifter for shifting said source block based on one of said second set of parameters, a first register for storing the shifted pixel block and receiving a latch signal from said state machine, a second register for storing the shifted pixel block from said second register and receiving a latch signal from said state machine, extractor for receiving the stored blocks from said register and extracting the data based on a parameter of the second set, and masking means for masking non-updatable pixels in a destination block.

Another embodiment of said invention provides a system for transferring a pixel source block to a pixel destination having shifter for shifting the source block, at least two registers for storing said shifted data, extractor for extracting said shifted data, and mask for masking pixels in said destination block that can not be modified and for receiving the extracted data and comprising parameter evaluation logic for receiving at least start address of said source block (SX), start address of said destination block (DX), number of pixels in said source block (BSW) and number of rows in said source block (BSH) and determining left shift number (LSHNO), two write flag (TWOW), two read flag (TWOR), number of read data (RDNO) from said source block, number of write data to said destination block (WRNO), left mask number (LMNO), and right mask number (RMNO).

Still another embodiment of the present invention is a method for performing a pixel block transfer from a source block to a destination block, comprising, reading said source block, inputting a first set of parameters into parameter evaluation logic, determining a second set of parameters from said parameter evaluation logic using said first set of parameters, shifting said source block based on a parameter from said second set, storing said shifted source block, extracting said stored source block and a second block of stored data based on a parameter of said second set, and masking said destination block according to mask enable signals and parameters from said second set.

A further embodiment of the method of the present invention involves inputting start address of said source block, inputting start address of said destination block, inputting number of pixels in said source block, and inputting number of rows in said source block, and using logic circuit to determine left shift number (LSHNO), using logic circuit to determine flags indicating if the transfer is a two write (TWOW) or a two read (TWOR), using logic circuit to determine number of read data from said source block (RDNO), using logic circuit to determine number of write data (WRNO) to said destination block, and using logic circuit to determine left mask number (LMNO) and right mask number (RMNO) indicating number of pixels which are not updatable in said destination block.

BRIEF DESCRIPTION OF THE DRAWINGS

FIG. 3 illustrates Examples 1 and 2.

DETAILED DESCRIPTION OF THE INVENTION

The present invention discloses hardware architecture and the related parameter calculation, whereby the load of word boundary problems on the software program is reduced. The only parameters required from software for the block transfer of the present invention are defined as follows:

SX is the start address on the X axis of the original block;

DX is the start address on the X axis of the destination block;

BSW is the number of pixels in the horizontal direction of the block to be transferred;

BSH is the number of rows of the block to be transferred;

HESX is the X coordinate value of the last pixel of each of the columns of the original block; and EDX is the X coordinate value of the last pixel of each of the columns of the destination block.

Figure 1:
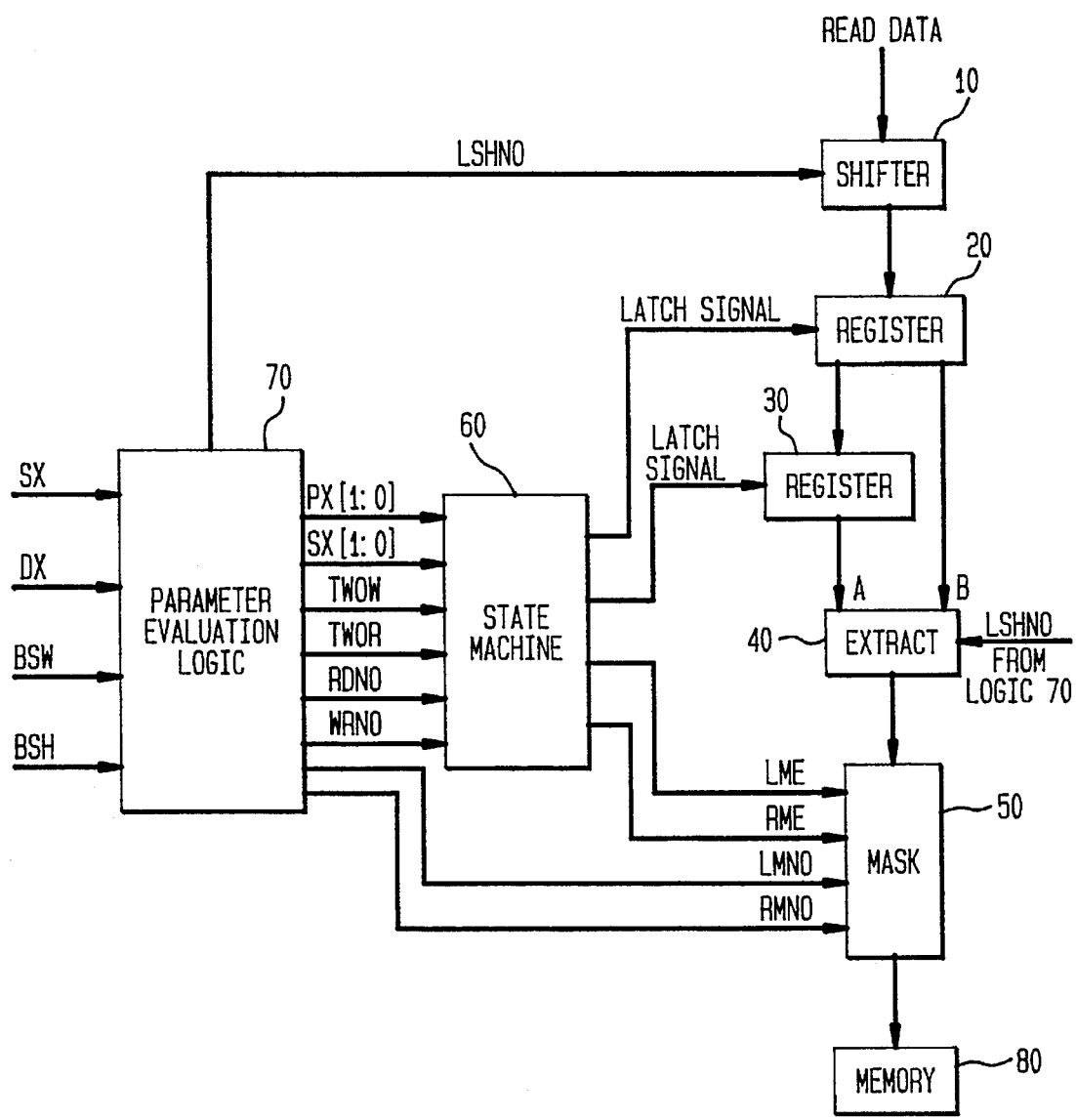
FIG. 1 shows the hardware architecture for the block transfer of the present invention.
Figure 2A:
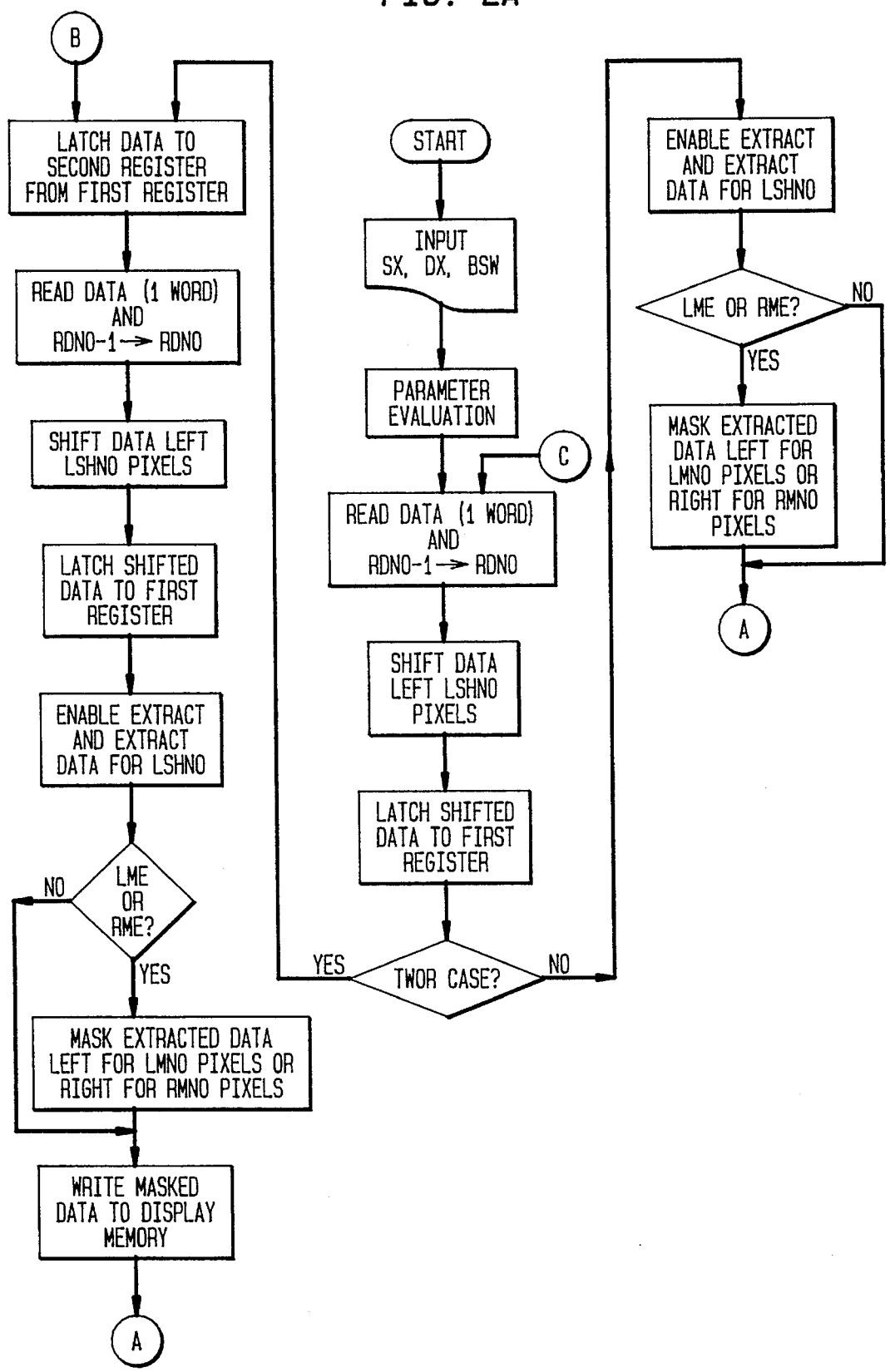
FIGS. 2A and 2B illustrate the process of the present invention.
Figure 2B:
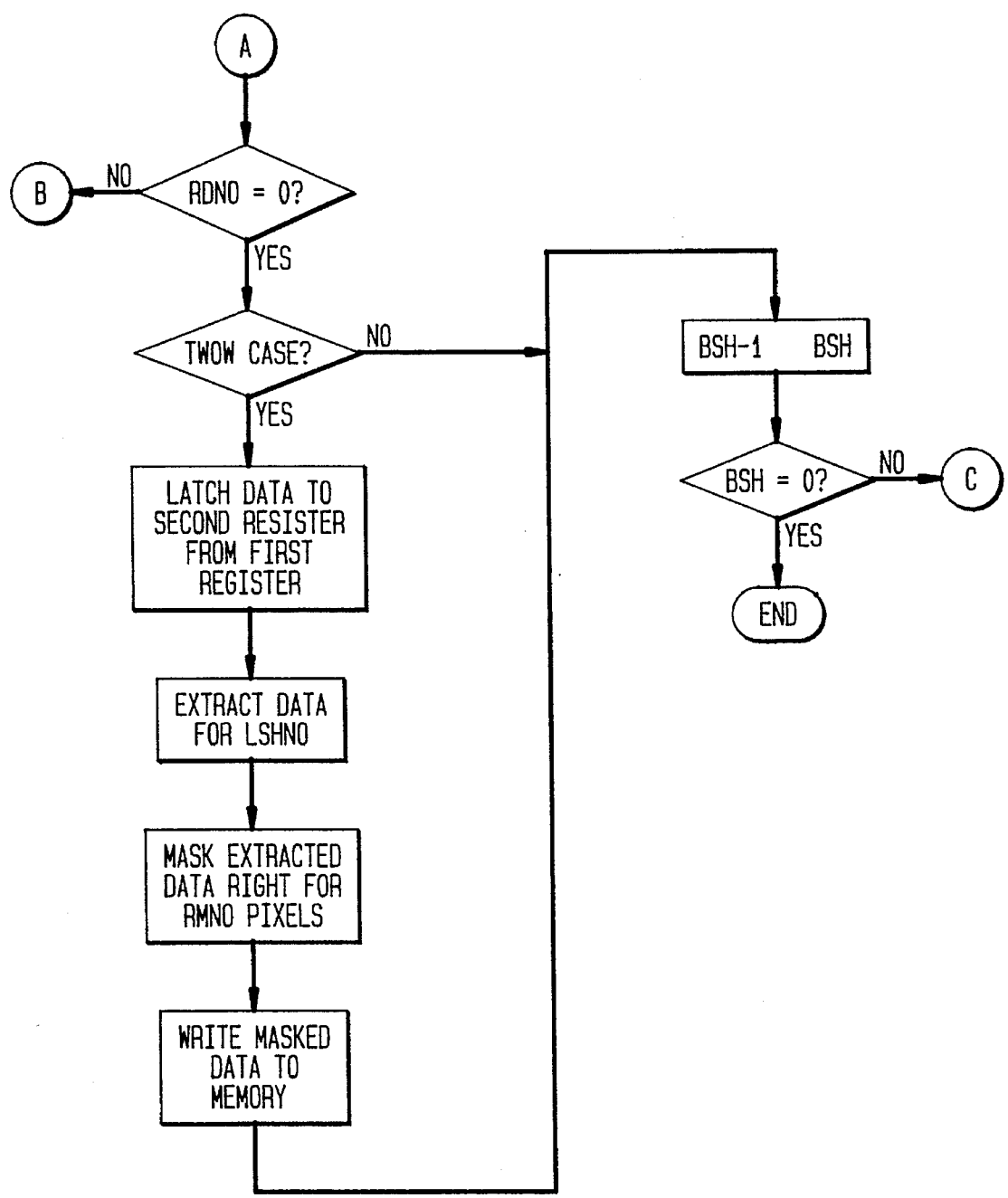

Referring to FIG. 1, Shifter 10 can be a barrel shifter or an end-around-left shifter or multiplexor. The shifter is denoted as a function of S:

S $((P_0, P_1, P_2, P_3), n) = (P_{n mod 4}, P_{(n+1) mod 4}, P_{(n+2) mod 4}, P_{(n+3) mod 4})$, e.g., $S(1,2,3,4)3) = (4,1,2,3)$.

EXTRACT 20 combines two sets of data received from the registers, 20 and 30, after being shifted, into one set which is denoted as a function of E:

| E$((A_0, A_1, A_2, A_3), (B_0, B_1, B_2, B_3), n) =$ $(C_0, C_1, C_2, C_3) =$ | | | | |
|---|---|---|---|---|
| n | $C_0$ | $C_1$ | $C_2$ | $C_3$ |
| 0 | $B_0$ | $B_1$ | $B_2$ | $B_3$ |
| 1 | $A_0$ | $A_1$ | $A_2$ | $B_3$ |
| 2 | $A_0$ | $A_1$ | $B_2$ | $B_3$ |

-continued

Figure 4:
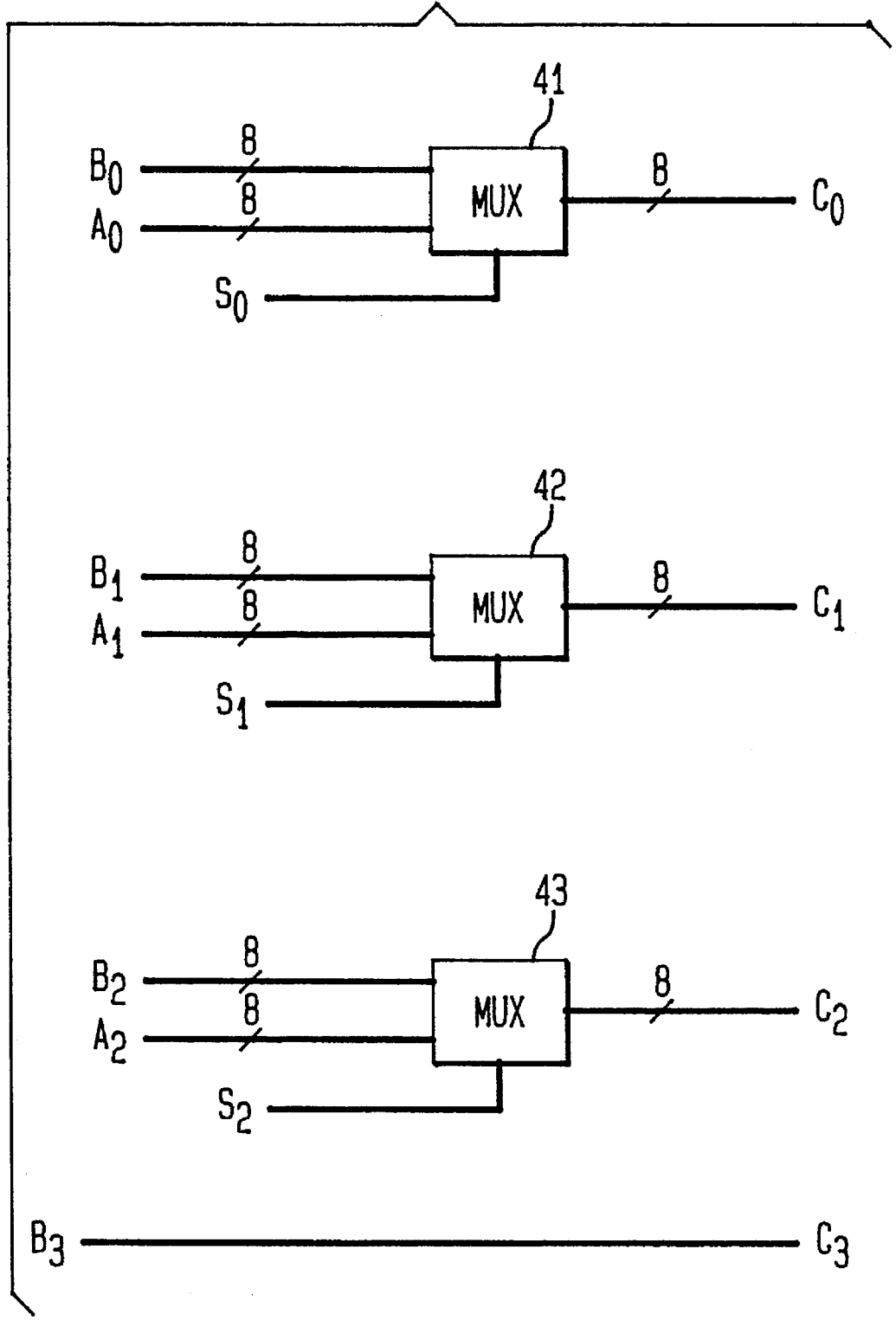
FIG. 4 shows one embodiment of the EXTRACT.

| | E((A_0, A_1, A_2, A_3), (B_0, B_1, B_2, B_3), n) = (C_0, C_1, C_2, C_3) = | | | |
|---|---|---|---|---|
| n | $C_0$ | $C_1$ | $C_2$ | $C_3$ |
| 3 | $A_0$ | $B_1$ | $B_2$ | $B_3$ | where the A values are from register 30 and the B values are from register 20. One embodiment of the Extract is shown in FIG. 4. Three multiplexors, 41, 42 and 43, are used to combine $A_0$ and $B_0$, $B_1$ and $A_1$, and $B_2$ and $A_1$. The control function S is a function of the left shift number (LSHNO), which is the number of pixels to be shifted, as follows:

$S_0$ = LSHNO(0) OR LSHNO(1)
$S_1$ = LSHNO(0) XOR LSHNO(1)
$S_2$ = $\overline{\text{LSHNO(1)}}$ AND LSHNO(0)

which gives

| LSHNO | $S_0$ | $S_1$ | $S_2$ | $S_3$ |
|---|---|---|---|---|
| 0 0 | 0 | 0 | 0 | 0 |
| 0 1 | 1 | 1 | 1 | 0 |
| 1 0 | 1 | 1 | 0 | 0 |
| 1 1 | 1 | 0 | 0 | 0 |

Register 20 can be a source latch and register 30 can be a template latch.

As an example of the EXTRACT 20, consider, E ((1, 2, 3, 4), (5, 6, 7, 8), 1)=(1, 2, 3, 8).

| n | $C_0$ | $C_1$ | $C_2$ | $C_3$ |
|---|---|---|---|---|
| 0 | 5 | 6 | 7 | 8 |
| 1 | 1 | 2 | 3 | 8 |
| 2 | 1 | 2 | 7 | 8 |
| 3 | 1 | 6 | 7 | 8 |

As explained above two types of block transfers must be considered: 1) Two write and 2) Two read. A two-write transfer is necessary when the destination addresses are in two separate words, that is they cross the word boundary. A two-read transfer is necessary when the source block (block to be transferred) crosses two word boundaries but only one write is needed because the destination is all in one word. Examples 1 and 2, discussed above, will now be discussed to illustrate the block transfer according to the present invention.

EXAMPLE 1

Two Write

Step 1: Read out (1,2,3,4) and shift 3 positions through the shifter 10, so that S((1,2,3,4), 3)=(4,1,2,3).
Step 2: Store results of shifting (4,1,2,3) in register 20.
Step 3: Input the values stored in register 30, i.e., (x,x,x,x) (where "x" means "don't care"), and register 20 into EXTRACT 40, so that E((x,x,x,x), (4,1,2,3), 3)=(x,1,2,3), where the value in the register 30 is (x,x,x,x) and the value of the register 20 is (4,1,2,3).

| n | $C_0$ | $C_1$ | $C_2$ | $C_3$ |
|---|---|---|---|---|
| 0 | 4 | 1 | 2 | 3 |
| 1 | X | X | X | 3 |
| 2 | X | X | 2 | 3 |
| 3 | X | 1 | 2 | 3 |

Step 4: Write (x,1,2,3) into a destination block of

| a | b | c | d | e | f | g | h |
|---|---|---|---|---|---|---|---|

.

Since it is desired that the value of the first pixel remain unmodified or updated, the value of the destination block becomes (a,1,2,3).

Step 5: Place the value in register 20, (4,1,2,3), into register 30 and repeat step 3 so that E((4,1,2,3), (4,1,2,3), 3)=(4,1,2,3)

| n | $C_0$ | $C_1$ | $C_2$ | $C_3$ |
|---|---|---|---|---|
| 0 | 4 | 1 | 2 | 3 |
| 1 | 4 | 1 | 2 | 3 |
| 2 | 4 | 1 | 2 | 3 |
| 3 | 4 | 1 | 2 | 3 |

Step 6: Write (4,1,2,3) into the destination block. Since it is desired that values of the second, third and fourth pixels remain unmodified or updated, the destination block becomes (4,f,g,h). The final destination block is:

| a | 1 | 2 | 3 | 4 | f | g | h |
|---|---|---|---|---|---|---|---|

EXAMPLE 2

Two Read Transfer

Step 1: Read original block (1,2,3,4) and move two positions through the shifter 10 so that S((1,2,3,4), 2) =(3,4,1,2).
Step 2: Store the results of Step 1 (3,4,1,2) in register 20.
Step 3: Repeat Step 1, for original block (5,6,7,8) so that S((5,6,7,8,1) =(7,8,5,6).
Step 4: Store the value which is in register 20, (3,4,1,2), in register 30 and then store the results from Step 3 (7,8,5,6) in register 20.
Step 5: Combine through EXTRACT 40 the values in registers 20 and 30 to form one set of data, so that E((3,4,1,2), (7,8,5,6), 2) =(3,4,5,6)

| n | $C_0$ | $C_1$ | $C_2$ | $C_3$ |
|---|---|---|---|---|
| 0 | 7 | 8 | 5 | 6 |
| 1 | 3 | 4 | 1 | 6 |
| 2 | 3 | 4 | 5 | 6 |
| 3 | 3 | 8 | 5 | 6 |

Step 6: Write (3,4,5,6) into the destination block.
The final destination block is:

| 3 | 4 | 5 | 6 | e | f | g | h |
|---|---|---|---|---|---|---|---|

In Example 1 the original block (1,2,3,4), after being read out, becomes two sets of data and then is written into the destination block. This phenomenon is defined as two-write, which is designated as signal TWOW. In Example 2, two blocks (1,2,3,4) and (5,6,7,8) have to be read to form (3,4,5,6) and then written into the destination block. This phenomenon is defined as a two-read, which is designated as signal TWOR. These two signals are used to control the operation of EXTRACT 40.

In the two-write case, (Example 1) EXTRACT 40 will generate two sets of data respectively when the last set of data has been read, whereas, in the two-read case (Example 2), the operation of the EXTRACT 40 will not start until two sets of data have been read and stored in the registers (20,30).

For the inventive system and method, the following parameters can be calculated from the above examples:

1. LSHNO is defined as the Left Shift Number for the shifter 10. It represents the number of pixels to be shifted by the shifter 10.

In Example 1, LSHNO=3, and in Example 2, LSHNO=2.

2. TWOR and TWOW flags signify what type of block transfer is occurring and control the registers. In Example 3, TWOR=0, TWO =1, and in Example 2, TWOR=1, TWOW= 0. TWOR is a two read transfer and TWOW is a two write transfer.

3. RDNO and WRNO, respectively, signify the Number of Read Data from the source block and Write Data to the destination block and are used to control the number of times data is written and read. Since, for these examples, the system is a word-access architecture, which processes 4 pixels at a time, BSW, which is expressed in pixels, has to be converted into a word unit. In Example 1, BSW=4 pixels, RDNO=1, WRNO=2, in Example 2, BSW =4 pixels, RDNO=2 and WRNO=1.

4. LMNO and RMNO designate Left Mask Number and Right Mask Number and refer to the number of pixels which are not modifiable or updatable in the left most or right most word of the destination block. In Example 1, LMNO=1, RMNO=3 and in Example 2, LMNO=RMNO=0.

These parameters are necessary for the block transfers and can all be generated by the parameter evaluation logic circuitry 70 using 4 inputs, SX, DX, BSW and BSH. General logic expressions for these parameters follow.

LSHNO can be generated as per the following examples

Original Block (S): | 1 | 2 | 3 | 4 |

SX [1:0] = 00

Destination Block (D) = | X | 1 | 2 | 3 | 4 | X | X | X |

DX [1:0] = 01

LSHNO = 00 − 01 = 00 + 11 = 3

And:

Original Block (S) = | X | 1 | 2 | 3 |

SX [1:0] = 01

Destination Block (D): | 1 | 2 | 3 | X |

DX [1:0] = 00

LSHNO = 01 − 00 = 01 = 1

From these examples a general logic expression for LSHNO can be determined as follows:

$$\text{LSHNO [1:0]} = (\text{SX [1:0]} - \text{DX [1:0]})\, \text{MOD4} \quad (1)$$
$$= (\text{SX [1:0]} + \overline{\text{DX [1:0]}} + 01)\, \text{MOD4}$$

(The "4" after MOD refers to the number of pixels per word.)

In Example 1,

SX [1:0]=00; DX[1:0]=1 so, LSHNO [1:0]=(00+10+01) MOD4=3 and in Example 2,

SX [1:0]=10, DX[1:0]=00 so, LSHNO [1:0]=(10+11+01) MOD4=2

2. TWOR can occur in several situations where the source block has a higher value starting address then the destination block:

a)

S: | X | X | X | 1 | 2 | 3 | 4 | X |

SX [1:0] = 11

D: | 1 | 2 | 3 | 4 |    D: | X | 1 | 2 | 3 | 4 | X | X | X |

DX [1:0] = 00         DX [1:0] = 01

D: | X | X | 1 | 2 | 3 | 4 | X | X |

DX [1:0] = 10 b)

S: | X | X | 1 | 2 | 3 | 4 | X | X |

SX [1:0] = 10

D: | 1 | 2 | 3 | 4 |    D: | X | 1 | 2 | 3 | 4 | X | X | X |

DX [1:0] = 00         DX [1:0] = 01 c)

S: | X | 1 | 2 | 3 | 4 | X | X |

SX [1:0] = 01

```
            -continued
D: | 1 | 2 | 3 | 4 |      DX [1:0] = 0
```

From these three situations, a general expression for TWOR can be determined:

In other words, if source block ("SB")=(x,x,x,1,2,3,4,x), SX[1:0]=11, then the source block is transferred to the destination block ("DB"), DX[1:0]=00, Destination Block is updated to (1,2,3,4)

DX[1:0]=01, Destination Block is updated to (x,1,2,3,4,x,x,x)

if SB=(x,x,1,2,3,4,x,x), and SX[1:0]=10, then the source block is transferred to the destination block, DX[1:0]=00, DB is updated to (1,2,3,4) DX [1:0]=01, DB is updated to (x, 1,2,3,4, x, x, x), if SB=(x, 1,2,3,4, x, x, x), SX [1:0]=01, then the source block is transferred to the destination block, DX[1:0]=00, DB is updated to (1,2,3,4).

*So, TWOR=(SX [1:0]>DX [1:0]).* (2)

3. TWOW can occur in several situations where the X coordinate value of the last pixel of the columns in the source block (HESX) is greater than that of the destination block (HEDX):

```
a)
S: | 1 | 2 | 3 | 4 |                              HESX [1:0] = 11

D: | X | X | X | 1 | 2 | 3 | 4 | X |              HEDX [1:0] = 10

D: | X | X | 1 | 2 | 3 | 4 | X | X |              HEDX [1:0] = 01

D: | X | 1 | 2 | 3 | 4 | X | X | X |              HEDX [1:0] = 00 b)
S: | X | X | 1 | 2 | 3 | 4 | X |                  HESX [1:0] = 10

D: | X | X | 1 | 2 | 3 | 4 | X | X | X |          HEDX [1:0] = 01

D: | X | 1 | 2 | 3 | 4 | X | X | X |              HEDX [1:0] = 00 c)
S: | X | X | 1 | 2 | 3 | 4 | X |                  HESX [1:0] = 01

D: | X | 1 | 2 | 3 | 4 | X | X | X |              HESX [1:0] = 00
```

From these situations, a general expression for TWOW can be determined:

$$TWOW = (HESX[1:0] > HEDX[1:0]). \quad (3)$$

where, $HESX[1:0]$ = $(BSW[1:0] + SX[1:0] - 1) \bmod 4$
= $TEMP1[2:0] \bmod 4$
= $(TEMP1[2] * 4 + TEMP1[1:0]) \bmod 4$
= $TEMP1[1:0],$ $HEDX[1:0]$ = $TEMP2[1:0]$, and $TEMP1[1:0]$ = $BSW[1:0] + SX[1:0] + 2'b11$ $TEMP2[2:0]$ = $BSW[1:0] + DX[1:0] + 2'b11,$ where 2'b11 indicates the use of the binary expression.

4. LMNO RMNO can be determined from examples 1 and 2, which give the following general expressions:

$$LMNO = \overline{DX\ [1:0]} \quad (4)$$
$$RMNO = \overline{HEDX\ [1:0]} \quad (5)$$

5. RDNO

As in Example 2, each column in the original block has four pixels. The third pixel position is the start address. Thus, the four pixels in the original block cross the word boundary and take up two words. It is, therefore, necessary to read the original block twice, RDNO=2. However, in Example 3, the start address is the first pixel of the word. The four pixels to be transferred, therefore, take up only one word and RDNO=1. The following conclusion is made for the calculation of RDNO, $$
\begin{aligned}
RDNO &= [(BSW[10:0] + SX[1:0])DIV4] + \\
&\quad [(BSW[1:0] + SX[1:0])MOD4 < >0] \\
&= [(BSW[10:2]*4 + BSW[1:0] + SX[1:0])DIV4] + \\
&\quad [(BSW[10:2]*4 + BSW[1:0] + SX[1:0])MOD4 < >0] \\
&= BSW[10:2] + [(BSW[1:0] + SX[1:0])DIV4] + \\
&\quad [(BSW[1:0] + SX[1:0]MOD4 < >0] \\
&= BSW[10:2] + (TEMP3[2:0]DIV4) + \\
&\quad TEMP3[2:0]MOD4 < >0) \\
&= BSW[10:2] + TEMP3[2] + (TEMP3[1:0] < >0) \\
&= BSW[10:2] + TEMP3[2] + \\
&\quad (TEMP3[1] = 1 \text{ or } TEMP3[0] = 1)
\end{aligned} \quad (6)
$$

where,
$TEMP3[2:0] = BSW[1:0] + SX[1:0].$
(BSW is in pixels.)

Applying this to Example 2,

BSW[10:2]=1, TEMP3[2:0]=2'b00+2'b10=3'b010 and,

RDNO=1+0+(1 or 0)=1+0+1=2

6. WRNO

As in Example 1, the start address in the original block to be transferred is at the second pixel position. The four pixels to be transferred from the original block to the destination block take up two words when they are written into the destination block. Thus, in Example 1, WRNO=2.

However, in Example 2, the start address in the destination block is at the first pixel position. The four pixels, to be transferred from the original block take up just one word in the destination block. Thus, WRNO=1 when the original block is to be written into one word of the destination block. The following conclusion is made:

$$\begin{aligned}
\text{WRNO} &= [(\text{BSW}[10:0] + \text{DX}[1:0])\text{DIV4}] + \\
&\quad [(\text{BSW}[1:0] + \text{DX}[1:0])\text{MOD4} \diamond 0] \\
&= [(\text{BSW}[10:2]*4 + \text{BSW}[1:0] + \text{DX1}:0])\text{DIV4}] + \\
&\quad [(\text{BSW}[10:2]*4 + \text{BSW}[1:0] + \text{DX}[1:0])\text{MOD4} \diamond 0] \\
&= \text{BSW}[10:2] + [(\text{BSW}[1:0] + \text{DX}[1:0])\text{DIV4}] + \\
&\quad [(\text{BSW}[1:0] + \text{DX}[1:0]\text{MOD4} \diamond 0] \\
&= \text{BSW}[10:2] + (\text{TEMP4}[2:0]\text{DIV4}) + \\
&\quad \text{TEMP4}[2:0]\text{MOD4} \diamond 0) \\
&= \text{BSW}[10:2] + \text{TEMP4}[2] + (\text{TEMP}[1]=1 \text{ or } \text{TEMP}[0]=1)
\end{aligned}$$

where,
TEMP4[2:0] = BSW[1:0] + DX[1:0],
(BSW is in pixels.)

Applying this expression to Example 2,
BSW[10:0]=4, BSW[10:2]=1, BSW[1:0]=2'b00, DX[1:0]=2'b01, TEMP4 [2:0]=2'b00+2'b01=3'b001 and
WRNO=1+0+(0 or 1)=1+0+1=2

The calculations found above are used to develop the hardware of the present invention. The parameter evaluation logic 70 uses the hardware to calculate these parameters based on four inputs. Therefore, the software only needs to define the start address coordinates in the original block, the start address coordinates in the destination block and the number of pixels to be transferred.

The above developed relations are derived from a situation where one word is defined to consist of 32 bits and each pixel consists of 8 bits. Four pixels are accessed each time. However, these relationships can be generalized to apply to situations where a word consists of $2^n$ bits, a pixel consists of $2^m$ bits and $2^k$ number of pixels are accessed each time. In these situations k=n−m and the greatest number of pixels that can be transferred is $2^{l+1}$.

1. LSHNO [k−1:0] = (SX[k−1:0] − DX[K−1:0]) MOD$2^k$ (1')
   = (SX[k−1:0] + DX[1:0] + 1) MOD$2^k$

2. TWOR = (SX[k−1:0] > DX[k−1:0]) (2')

3. TWOW = (HESX[k−1:0] > HEDX[k−1:0]) (3')

where,

HESX[k−1:0] = BSW[k−1:0] + SX[k−1:0] − 1 MOD$2^k$
 = TEMP1[k:0] MOD$2^k$
 = TEMP1[k−1:0]
TEMP1[k:0] = BSW[k−1:0] + SX[k−1:0] − 1
HEDX[k−1:0] = TEMP2[k−1:0]
TEMP2[k:0] = BSW[k−1:0] + DX[k−1:0] − 1

4. LMNO = DX[k−1:0] (4')
   RMNO = $\overline{\text{HEDX}}$[k−1:0] (5')
5. RDNO = BSW[l:k] + TEMP3[k] + (TEMP3[k−1] OR TEMP3[k−2] OR ... OR TEMP3[0]) (6')

where,

TEMP3[k:0] = BSW[k−1:0] + SX[k−1:0]

6. WRNO = BSW[l:k] + TEMP4[k] + (TEMP4[k−1] OR TEMP4[k−2] OR ... OR TEMP4[0]) (7')

where,

TEMP4[k:0] = BSW[k−1:0] + DX[k−1:0]

In addition, the left shifter function of the shifter 10 is obtained from $S((P_0, P_1, P_2, \ldots, P_{2^k-1}) = (P_{xmod2^k}, P_{(x+1)mod^k}, \ldots, P_{x+2^k-1)mod2^k})$ and the EXTRACT 50 function E is calculated as follows.

$E((A_0, A_1, \ldots, A_{2^k-1}), (B_0, B_1, \ldots B_{2^k-1}), x) = (A_0, A_1, \ldots A_{x-1}, B_x, B_{x+1}, \ldots, B_{2^k-1})$
if X=0, E(A,B,X)=B.

Referring to the Figures, the block transfer of the present invention operates as follows:

Step 1: SX, DX, BSW and BSH are input into the parameter evaluation logic circuit 70. The parameters, LSHNO, TWOR, TWOW, RDNO, WRNO, LMNO and WRNO, are found using the logic circuits discussed above.

Step 2: TWOR, TWOW, RDNO and WRNO are input to a state machine 60 for controlling pixel transfer.

Step 3: The data word is then read by the shifter 10 and the RDNO parameter is decreased by one.

Step 4: LSHNO pixels in the word are then shifted to the left.

Step 5: The shifted data is latched to register 20.

Step 6: The state machine 60 determines if this is a two write case based on the TWOR and TWOW signals input into the state machine 60 from the parameter evaluation 70.

Step 7: If the case is not a two-read situation, as in Example 1, the EXTRACT 40 is enabled and data is extracted for LSHNO pixels, LSHNO was inputted to the EXTRACT 40 by the parameter evaluation logic 70.

Step 8: The state machine 60 determines if LME or RME are active. LME is Left Mask Enable signal which is active when the first word is written to memory 80 and RME is the Right Mask enable signal which is active when the last word is written to memory 80.

Step 9: If LME is active, the MASK 50, which can be a memory interface, masks the extracted data for left LMNO pixels and if the RME signal is active, the MASK 50 will mask the extracted data for RMNO pixels. LMNO and RMNO were input to the MASK 50 from the parameter evaluation logic 70.

Step 10: Once the data is masked, or if neither LME or RME is active, the state machine 60 determines if RDNO equals zero.

Step 11: If RDNO=zero, the state machine 60, determines if it is a two write case. If RDNO ≠ 0, the procedure goes to Step 14. Otherwise the data is latched from register 20 to register 30 and data is extracted for LSHNO pixels.

Step 12: The MASK 50 then masks extracted data for right RMNO pixels and writes the masked data to memory 80.

Step 13: BSH, the height of the moving block, is decreased by one. If BSH=0 then the transfer is over, if BSH ≠ 0 the procedure goes back to Step 3.

Step 14: If the state machine in Step 6 determines that it is a two write case, the data is latched from register 20 to register 30.

Step 15: The data (1 word) is read and RDNO is decreased by one.

Step 16: The data is shifted left LSHNO pixels by the shifter 10 and the shifted data is latched to register 20.

Step 17: The Extract 40 is enabled and data is extracted for LSHNO.

Step 18: The state machine determines if either LME or RME is active. If one of the signals is active, the MASK 50 will mask extracted data left for LMNO pixels or right for RMNO pixels.

Step 19: Once the data is masked in Step 19, or if neither LME or RME is active, the masked data is written to memory, and the procedure continues to Step 10.

The above mentioned embodiments of the invention are intended to be illustrative only. Numerous alternative embodiments may be devised by those skilled in the art without departing from the scope of the following claims.

We claim:

1. A system for a pixel block transfer operation of a source block to a destination block comprising, parameter evaluation logic which receives a first set of parameters and outputs a second set of parameters based on said first set of parameters, wherein said first set of parameters comprises
a start address of said source block (SX),
a start address of said destination block (DX),
a number of pixels in said source block (BSW), and
a number of rows of said source block (BSH), and wherein said second set of parameters comprises,
a left shift number (LSHNO),
flags (TWOW) and (TWOR) indicating whether data is to be written into two words of said destination block or whether data is to be read from two words of said source block
a number of data to be read from said source block (RDNO),
a number of data to be written said destination block (WRNO),
a left mask number (LMNO) indicating a number of pixels in a left hand word
of said destination block which cannot be modified, and
a right mask number (RMNO) indicating a number of pixels in a right hand word of said destination block which cannot be modified, state machine which receives said parameters TWOW, TWOR, RDNO, WRNO from said second set of parameters and said parameters SX, DX of the first set, shifter for shifting said source block based on said parameter LSHNO of said second set of parameters, a first register for storing said shifted source block in response to a latch signal from said state machine, a second register for storing said shifted source block outputted from said first register in response to a latch signal from said state machine, extractor for receiving said shifted blocks outputted from said second register and extracting data therefrom based on said LSHNO parameter of the second set, and masking means for masking selected pixels in said destination block based on said LMNO and RMNO parameters of said second set.

2. The system of claim 1, further comprising a memory for storing results of the masking means.

3. The system of claim 1, wherein said parameter evaluation logic further comprises, logic circuit for determining a left shift number (LSHNO), logic circuit for determining flags indicating if the transfer is a two write (TWOW) or a two read (TWOR), logic circuit for determining a number of read data (RDNO) from said source block and number of write data (WRNO) to said destination block, and logic circuit for determining left mask number (LMNO) and right mask number (RMNO) indicating number of pixels which are not updatable in said destination block.

4. The system of claim 1, wherein said parameter used by said shifter and said extractor is a left shift number determined by the parameter evaluation logic.

5. The system of claim 1, wherein said state machine transmits left and right mask enable signals to said masking means and said parameter evaluation logic transmits two parameters from said second set to said masking means.

6. The system of claim 1, wherein said state machine transmits left and right mask enable signals to said masking means and said parameter logic transmits said parameters LMNO and RMNO to said masking means.

7. The system of claim 1, wherein said state machine determines if the transfer is a two word read or a two word write transfer.

8. A method for performing a pixel block transfer from a source block to a destination block, comprising:

reading said source block, inputting a first set of parameters into parameter evaluation logic, wherein said first set of parameters comprises
a start address of said source block (SX),
a start address of said destination block (DX)
a number of pixels in said source block (BSW),and
a number of rows of said source block (BSH), and determining a second set of parameters from said parameter evaluation logic using said first set of parameters, wherein said second set of parameters
a left shift number (LSHNO),
flags indicating if the transfer is a two write (TWOW) or a two read (TWOR) transfer, shifting said source block based on said LSHNO parameter from said second storing said shifted source block, extracting data from said stored source block based on said LSHNO parameter of said second set, and masking said destination block according to mask enable signals and said parameters LSHNO and RSHNO from said second set.

9. The method of claim 8, wherein said step of determining a second set of parameters, further comprises, using a logic circuit to determine said left shift number (LSHNO), using a logic circuit to determine said flags (TWOW and TWOR) indicating if the transfer is from two words of said source block or to two words of said destination block, using logic circuit to determine said number of read data from said source block (RDNO), using logic circuit to determine said number of write data (WRNO) to said destination block, and using logic circuit to determine said left mask number (LMNO) and said right mask number (RMNO) indicating number of pixels which are not updatable in said destination block.

10. The method of claim 9, further comprising, shifting said source block based on said left shift number and extracting data based on said left shift number.

11. The method of claim 9, further comprising masking pixels in said destination according to said left and right mask numbers.

12. The method of claim 9, further comprising, determining if said transfer is from two words of said source block or to two words of said destination block.

13. A system for transferring a pixel source block to a pixel destination having a state machine, a shifter for shifting the source block, at least two registers for storing said shifted data, an extractor for extracting said shifted data, and a mask circuit for masking pixels in said destination block that can not be modified and for receiving the extracted data, comprising, parameter evaluation logic for receiving at least a start address of said source block (SX), a start address of said destination block (DX), a number of pixels in said source block (BSW) and a number of rows in said source block (BSH) and outputting a left shift number (LSHNO) to said shifter and said extractor, a two write flag (TWOW), a two read flag (TWOR), a number of read data (RDNO) from said source block, and a number of write data to said destination block (WRNO) to said state machine, and a left mask number (LMNO), and a right mask number (RMNO) to said mask circuit.

14. The system of claim 13, wherein said parameter evaluation logic determines said left shift number using $(SX[k-1:0]+DX[1:0]+1)MOD2^k$.

15. The system of claim 13, wherein said parameter evaluation logic determines said two read flag using $(SX[k-1:0]>DX[k-1:0])$.

16. The system of claim 13, wherein said parameter evaluation logic determines said two write flag using $(BSW[k-1:0]+SX[k-1:0]-1)MOD2^k >(BSW[k-1:0]+DX[k-1:0]-1)$.

17. The system of claim 13, wherein said parameter evaluation logic determines said left mask number using $DX[k-1:0]$.

18. The system of claim 13, wherein said parameter evaluation logic determines said right mask number using $\overline{BSW[k-1:0]+DX[k-1:0]-}$.

19. The system of claim 13, wherein said parameter evaluation logic determines said number of read data using $BSW[1:k]+TEMP\#[k]+(TEMP\#[k-1]OR\ TEMP3\ [k-2]\ OR\ \ldots\ OR\ TEMP3\ [0])$ where $TEMP3\ [k:0]=BSW[k-1:0]+SX[k-1:0]$.

20. The system of claim 13, wherein said parameter evaluation logic determines said number of write data using $BSW[1:k]+TEMP4[k]+(TEMP4[k-1]OR$ $TEMP4\ [k-2]OR\ \ldots\ OR\ TEMP4\ [0])$ where $TEMP4[k:0]=BSW[k-1:0]+DX[k-1:0]$.

21. The system of claim 13, wherein said state machine determines if the transfer is a two write or a two read transfer.

22. The system of claim 13, wherein said state machine sends left mask enable and right mask enable signals to said mask circuit.

23. The system of claim 13, wherein said state machine sends latch signals to said at least two registers.

24. The system of claim 13, further comprising a memory for receiving a final destination block from said memory.

* * * * *